United States Patent [19]

Miyamoto

[11] Patent Number: 4,868,621

[45] Date of Patent: Sep. 19, 1989

[54] INPUT PROTECTION CIRCUIT

[75] Inventor: Junichi Miyamoto, Yokohama, Japan

[73] Assignee: Kabushiki Kaisha Toshiba, Kawasaki, Japan

[21] Appl. No.: 167,194

[22] Filed: Mar. 11, 1988

[30] Foreign Application Priority Data

Mar. 31, 1987 [JP] Japan .................................. 62-79172

[51] Int. Cl.$^4$ ...................... H01L 29/90; H01L 29/78; H02H 9/04
[52] U.S. Cl. .............................. 357/23.13; 307/200.1; 361/91; 357/13
[58] Field of Search .............................. 357/23.13, 13; 307/200 B; 361/91

[56] References Cited

U.S. PATENT DOCUMENTS 4,449,158 5/1984 Taira ................................ 357/23.13

FOREIGN PATENT DOCUMENTS 0057024 8/1982 European Pat. Off. .......... 357/23.13

Primary Examiner—Eugene R. LaRoche
Assistant Examiner—Michael Shingleton
Attorney, Agent, or Firm—Foley & Lardner, Schwartz, Jeffery, Schwaab, Mack, Blumenthal & Evans

[57] ABSTRACT

An input protection circuit for prevention of electrostatic breakdown is provided. This circuit comprises, on a semiconductor substrate of a first conductivity type, a heavily doped region of a second conductivity type connected to an input terminal and a heavily doped region of the first conductivity type so that they are in contact with each other. This circuit may further include another heavily doped region of the second conductivity type connected to the ground level with it being opposite to the heavily doped region of the second conductivity type provided in the above-mentioned elementary circuit configuration. Thus, the p-n junction comprising heavily doped regions is formed to thereby lower the junction breakdown voltage when a breakdown due to an input of a high potential occurs, resulting in an increased electrostatic withstand voltage.

7 Claims, 4 Drawing Sheets

1

INPUT PROTECTION CIRCUIT

BACKGROUND OF THE INVENTION

This invention relates to an input protection circuit and, more particularly, to an input protection circuit for protecting electrostatic breakdown.

A conventional input protection circuit or network is shown in FIG. 7. An input terminal IN is connected to the gate of a MOS FET 30 through a diode 28 and a transistor 29 the other ends of which are connected to the ground terminals GND serving as reference power sources, respectively. This diode 28 is constituted by a p-n junction comprised of an n+ doped region 31 formed on a p-type semiconductor substrate 1. The n+ doped region 31 is connected to the input terminal IN and to the gate of the MOS FET 30. The transistor 29 is an NPN transistor comprising n+ doped regions 31 and 32 formed on the p-type semiconductor substrate 1 so that the n+ doped regions 31 and 32 are opposite to each other. One n+ type doped region 32 is connected to the ground terminal GND.

When a negative high potential with respect to the ground level is applied to the input terminal IN, a current flows from the ground terminal GND via the diode 28. In contrast, when a positive high potential with respect to the ground level is applied to the input terminal IN, the p-n junction of the diode 28 breaks down. As a result, a current flows to the ground terminal GND and the transistor which is placed in build-in state is turned on. In addition, an excessive or extra current flows to the ground terminal GND via the transistor 29. Thus, the function of the input protection is performed.

Accordingly as high integration and miniaturization or fineness of MOS integrated circuits have beed developed in recent years, a value higher than electrostatic withstand voltage as required conventionally has been demanded while the thickness of the gate oxide film is thinned. However, the above-mentioned input protection circuit has the problem that the ability of protection against a positive high potential with respect to the ground level GND is weak. Specifically, since the n+ type doped region 31 of high concentration is formed at the same time on the p-type semiconductor substrate 1 of low concentration while the source and the drain of, e.g., an n channel MOS FET of the MOS integrated circuit are formed, the junction breakdown voltage of the p-n junction of the diode 28 is raised to a higher value, e.g., about 15 volts, resulting in the problem that high electrostatic withstand voltage cannot be obtained.

The breakdown of the p-n junction of the diode 28 occurs at the portion where the electric field concentration appears maximum. However, it is difficult to actually specify the site or position where such a breakdown would occur. It has been ordinarily said that the site where breakdown occurs at the maximum possibility is the portion where the p-n junction curves. However, it is impossible to specify where breakdown occurs, i.e., it takes place at the portion B or C shown in FIG. 7(b). The possibility of occurrence of breakdown is influenced by unevenness or variation of the impurity concentration at the portion. For example, if breakdown occurs at the portion B, the parasitic NPN transistor is likely to be turned on, with the result that strong protection ability becomes effective with respect to the electrostatic breakdown. On the other hand, if breakdown occurs at the portion C, such a protection ability becomes weak. Specifically, there occurs the problem that the protection ability with respect to the electrostatic breakdown is fluctuated by the unevenness or variation of the impurity concentration at the p-n junction of the diode 28.

Moreover, when the p-n junction of the diode 28 breaks down, there is no component serving as a ground contact such as a p+ impurity region on the side of the p-type semiconductor substrate of low concentration. This results in the problem that a current produced due to the fact that the above junction has broken down strays, leading to the possibility that latch-up etc. are caused particularly in the case of CMOS.

A further problem lies in that when the p-n junction of the diode 28 breaks down, electric field concentrates on, e.g., a corner portion of the n+ type doped region 31, resulting in the possibility that the breakdown of the junction itself is caused by a large current produced at that portion.

A still further problem is as follows: If breakdown is caused at the p-n junction portion directly below the contact portion between, e.g., the n+ type doped region 31 and the metal wiring layer 33 connected to the input terminal IN by the inhomogeneity of the impurity concentration at the p-n junction of the diode 28 or other unfavorable phenomena, the metal wiring layer 33 at the contact portion is melted by the heat produced by the breakdown, resulting in the possibility that the breakdown of the p-n junction is caused.

As just described above, the conventional input protection circuit or network has the problem that the protection ability is not fully effective for a high potential with respect to the ground level GND.

SUMMARY OF THE INVENTION

An object of this invention is to provide an input protection circuit in which ability of preventing electrostatic breakdown by an input of high potential is enhanced.

The above-mentioned object of this invention is accomplished by an input protection circuit comprising: a heavily doped region of a second conductivity type formed on a semiconductor of a first conductivity type and connected to an input terminal; and a heavily doped region of said first conductivity type formed on said semiconductor substrate of said first conductivity type with it being in contact with said heavily doped region of said second conductivity type.

In addition, the above-mentioned object of this invention is accomplished by an input protection circuit comprising: a first heavily doped region of a second conductivity type formed on a semiconductor substrate of a first conductivity type, and connected to an input terminal; a heavily doped region of a first conductivity type formed on said semiconductor substrate of said first conductivity type with it being in contact with said first heavily doped region of said second conductivity type; and a second heavily doped region of said second conductivity type formed on said semiconductor substrate of said first conductivity type with it being opposite to said first heavily doped region of said second conductivity type, and connected to a reference power source.

The input protection circuit according to this invention is implemented to form a p-n junction comprising heavily doped regions of opposite conductivity types to thereby lower the junction breakdown voltage when breakdown due to an input of a high electric potential occurs, thus allowing the electrostatic withstand voltage to be raised.

DETAILED DESCRIPTION OF THE INVENTION

Figure 1A:
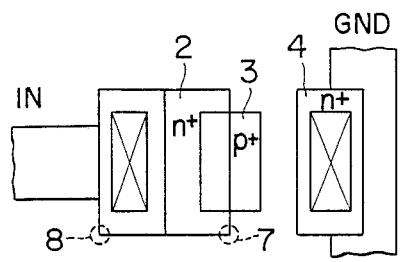
FIGS. 1(a) and 1(b) are a plan view and a cross sectional view showing an input protection circuit according to a first embodiment of this invention, respectively.
Figure 1B:
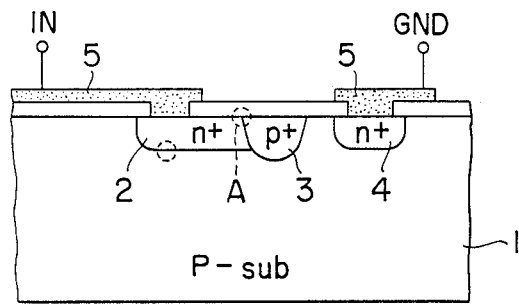

An input protection circuit or network according to a first embodiment of this invention is shown in FIG. 1 wherein FIG. 1(a) is a plan view of the input protection circuit and FIG. 1(b) is a cross sectional view thereof. On a p-type semiconductor substrate 1, an n+ doped region 2 is formed. In contact with the n+ type doped region 2, a p+ type doped region having a concentration greater than that of the substrate 1 is formed. In addition, oppositely to the n+ type doped region 2, an n+ type doped region 4 is formed. These n+ type doped regions 2 and 4 are connected to an input terminal IN and a ground terminal GND through a metal wiring layer 5, respectively. In this example, the p+ type doped region 3 is located between n+ type doped regions 2 and 4 and the p+ type doped region 3 and the n+ type doped region 4 are not in contact with each other.

Thus, the p+ type doped region 3 and the p-type semiconductor substrate 1, and the n+ doped region 2 form a diode constituted by the p-n junction. There is also formed an NPN transistor of a structure comprising the p+ type doped region 3 and the p-type semiconductor substrate 1 sandwiched between the two n+ type doped regions 2 and 4.

The operation of the input protection circuit or network thus constituted will be described below. When a negative high potential with respect to the ground level is applied to the input terminal IN, a current flows from the ground terminal GND via the above-mentioned diode. In contrast, when a positive high potential with respect to the ground level is applied to the input terminal IN, the p-n junction of the diode breaks down. As a result, a current flows to the ground terminal GND and the above-mentioned NPN transistor is turned on. In addition, an excessive or extra current flows to the ground terminal GND via the NPN transistor. Thus, the function of input protection is performed with respect to the high potential applied to the input terminal IN.

Where the p-n junction of the diode breaks down, such a breakdown is most likely to occur at the portion A shown in FIG. 1(b). This is because the portion A is the junction portion of the n+ type doped region 2 and the p-type doped region 3 which have high concentration, and thus spreading of the depletion layer is minimum at this portion, so that electric field is most apt to concentrate thereon. Thus, the withstand voltage is lowered to the breakdown voltage when a positive high potential is applied to the input terminal IN, resulting in the advantage that the electrostatic withstand voltage is increased.

It is possible to specify the site or place where the p-n junction of the diode breaks down to be the junction portion of the n+ type dope region 2 and the p+ type doped region 3. In addition, a breakdown current produced at time serves to deliver a base current to the above-mentioned NPN transistor. Accordingly, the parasitic NPN transistor is turned on readily and stably, thus making it possible to improve the electrostatic withstand voltage. The ability of protection against the electrostatic breakdown can be stably exhibited without influence of unevenness or variation in the impurity concentration.

Since the p+ type doped region 3 serving as a ground contact exists in addition to the fact that the site where breakdown occurs can be specified, there is no possibility that a breakdown current produced strays. This results in no possibility that latch-up is caused in the case of CMOS.

In addition, the problem of the junction breakdown at the corner portion of, e.g., the n+ type doped region 2 which was questioned when the p+ type doped region 3 is not present, and/or the problem that the metal wiring layer 5 of the contact portion is melted due to heat produced when breakdown occurs, e.g., at the contact portion of the metal wiring layer 5 and the n+ type doped region 2 connected to the input terminal IN, resulting in occurrence of junction breakdown, can be solved.

As described above, the input protection circuit or network according to this embodiment is implemented to provide the p+ type doped region 3 in contact with the n+ type doped region 2 to thereby lower the junction breakdown voltage with respect to an input of a positive high potential to cause a stable breakdown, thus making it possible to greatly improve the withstand voltage with respect to the electrostatic breakdown.

While the n+ type doped region 4 connected to the ground base GND is provided to form a parasitic NPN transistor in the above-mentioned first embodiment, the provision of the n+ type doped region 4 may be omitted. In such a case, the function of the input protection network is performed principally by the diode constituted by the p-n junction comprising the p+ type doped region 3 and the n+ type doped region 2.

Further, while the p+ type doped region is positioned between two n+ type doped regions 2 and 4 in the above-mentioned first embodiment, it is not required that the site where the p+ type doped region 3 is provided is not limited to the above position. It is to be noted that when the p+ type doped region is located between two n+ type doped regions 2 and 4, it can be expected that the breakdown current functions to allow the parasitic NPN transistor to be readily turned on when breakdown occurs.

Figure 2A:
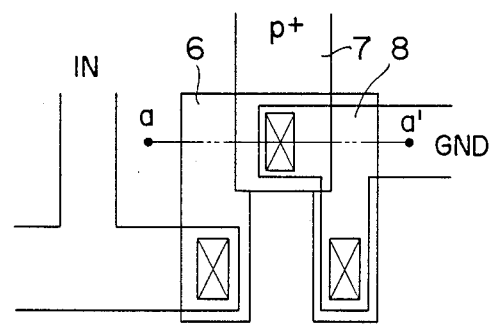
FIGS. 2(a) and 2(b) are a plan view and a cross sectional view showing an input protection circuit according to a modification of the first embodiment of this invention, respectively.
Figure 2B:
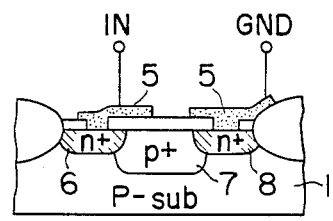

Furthermore, while the p+ type doped region 3 and the n+ type doped region 4 are not in contact with each other in the above-mentioned first embodiment, such two regions may be in contact with each other. An input protection network of this modification is shown in FIG. 2 wherein FIG. 2(a) is a plan view of the input protection circuit or network and FIG. 2(b) is a cross sectional view thereof. In the same manner as in the first embodiment, on the p-type semiconductor substrate 1, n+ type doped region connected through the input terminal IN and metal wiring layer 5, p+ type doped region 7 in contact with the n+ type doped region 6, and n+ type doped region 8 connected to ground base GND and metal wiring layer 5 are formed. This embodiment differs from the above-mentioned first embodiment in that the p+ type doped region 7 and the n+ type doped region 8 are in contact with each other.

Figure 3A:
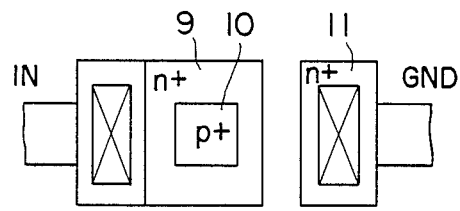
FIGS. 3(a) and 3(b) are a plan view and a cross sectional view showing an input protection circuit according to a second embodiment of this invention, respectively.
Figure 3B:
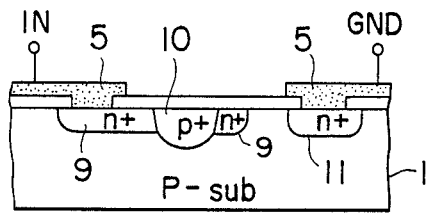

An input protection circuit or network according to a second embodiment of this invention is shown in FIG. 3 wherein FIG. 3(a) is a plan view of the input protection circuit and FIG. 3(b) is a cross sectional view thereof. On the p-type semiconductor substrate 1, an n+ type doped region 9 connected to the input terminal IN through the metal wiring layer 5 is formed. A p+ type doped region 10 is formed in contact with the n+ type doped region 9 so as to surround its periphery. In addition, an n+ type doped region 11 connected to the ground terminal GND through the metal wiring layer 5 is formed with it being opposite to the n+ type doped region 9.

According to this embodiment, since the periphery of the p+ type doped region 10 is completely surrounded by the n+ type doped region 9, the breakdown occurring when a positive high potential is applied to the input terminal IN becomes still more stable as compared to that in the first embodiment, with the result that the withstand voltage with respect to the electrostatic breakdown becomes stable accordingly.

While, in the second embodiment, the n+ type doped region 11 connected to the ground terminal GND is provided to form the parasitic NPN transistor in the same manner as in the above-mentioned first embodiment, the provision of the n+ type doped region 11 may be omitted.

Figure 4A:
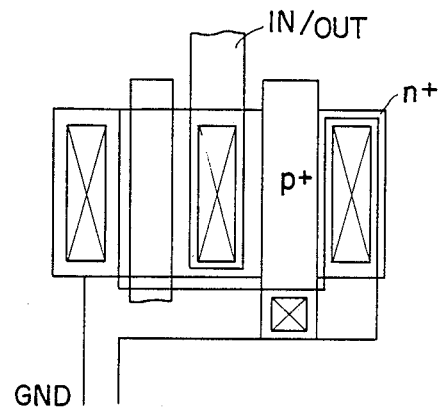
FIGS. 4(a) and 4(b) are a plan view and a cross sectional view showing an input protection circuit according to a third embodiment of this invention, respectively.
Figure 4B:
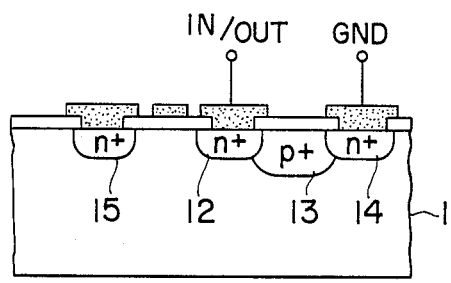

An input protection circuit or network according to a third embodiment of this invention is shown in FIG. 4 wherein FIG. 4(a) is a plan view of the input protection circuit and FIG. 4(b) is a cross sectional* view thereof. On the p-type semiconductor substrate 1, an n+ type doped region 12 connected to the input/output terminal IN/OUT is formed. A p+ type doped region 13 is formed in contact with the n+ type doped region 12. An n+ type doped region 14 connected to the ground base GND is formed with it being opposite to the n+ type doped region 12. In addition, an n+ type doped region 15 is formed with it being opposite to the n+ type doped region 12.

Thus, the p+ type doped region 13 and the p-type semiconductor substrate 1, and the n+ type doped region 12 form a diode. Th* n+ type doped region 12, the p+ type doped region 13 and the n+ type doped region 14 form a parasitic NPN transistor. In addition, the two n+ type doped regions 15 and 12 opposite to each other form the source and the drain of the n channel MOS FET, respectively. Specifically, this embodiment is characterized in that the input protection network and the n channel MOS FET of the output buffer are combined with each other. The n+ type doped region 12 of the input protection network is used in common to the drain of the n channel MOS FET of the output buffer, and the input terminal IN connected to the n+ type doped region 12 is used in common to the output terminal OUT, thus serving as the input/output terminal IN/OUT.

According to this embodiment, the input protection circuit or network is used in common to the output buffer, thus making it possible to provide the output function and to improve the electrostatic withstand voltage, in the input mode, in the same manner as in the above-mentioned first embodiment.

In the third embodiment, the n+ type doped region 14 connected to the ground base is provided to form a parasitic NPN transistor in the same manner as in the above-mentioned first and second embodiments, the provision of the n+ type doped region 14 may be omitted.

Figure 5:
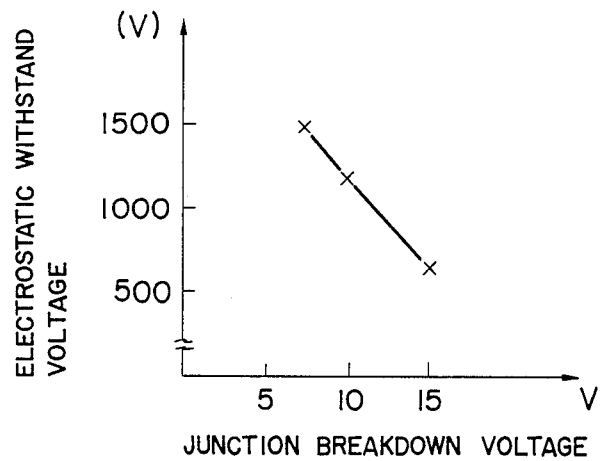
FIG. 5 is a graph showing the relationship between the p-n junction breakdown voltage and the electrostatic withstand voltage of an input protection circuit according to this invention.
Figure 7A:
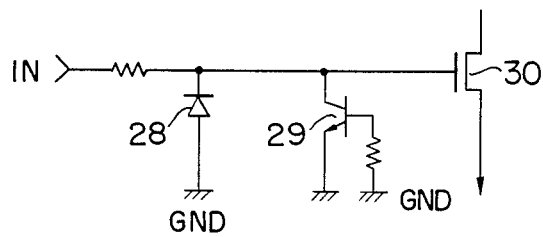
FIGS. 7(a) and 7(b) are a circuit diagram and a cross sectional view showing a conventional input protection circuit.
Figure 7B:
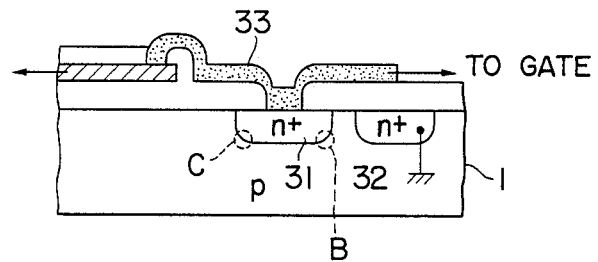

The method of manufacturing an input protection circuit or network according to this invention will be now described. FIG. 5 is a graph showing the relationship between the p-n junction breakdown voltage and the electrostatic withstand voltage measured by varying the impurity concentration on the side of the p+ type doped region in connection with the p-n junction of the diode formed in the input protection network accordingly to this invention. As shown in this graph, according as the impurity concentration of the p+ type doped region rises, the p-n junction breakdown voltage, i.e., the breakdown withstand voltage lowers, whereas the electrostatic withstand voltage rises inversely in proportion thereto. Therefore, by controlling the impurity concentration of the p+ type doped region, a required electrostatic withstand voltage can be obtained.

In the fabrication of MOS integrated circuits including an input protection network, there is a process to form the source and/or drain regions of, e.g., p channel MOS FET. If the impurity concentrations of these source and drain regions are in conformity with the impurity concentration of the p+ type doped region of the input protection network according to this invention, the input protection network can be manufactured without increasing the number of steps. FIG. 6 is a process diagram showing a method of manufacturing an input protection circuit or network without increasing the number of steps.

First, on a p-type semiconductor substrate 1, an n-type well 16 is formed. By field oxide films 17, active regions are formed separately from each other. Further, by accumulation of polysilicon layer and selective etching, gate electrodes 18 are formed at predetermined sites or portions (FIG. 6(a)).

Then, resists 19 are formed at predetermined sites or portions. Thereafter, N+ ion implantation is implemented to form n+ type doped regions 20 and 21 as the source and the drain of the n channel MOS FET, respectively, and to form at the same time n+ type doped regions 22 and 23 in the input protection network (FIG. 6(b)).

Further, after resists 19 are formed at predetermined sites or portions, p+ ion implantation is implemented to form p+ type doped regions 24 and 25 as the source and the drain of the p channel MOS FET, respectively, and to form at the same time a p+ type doped region 26 in the input protection network. At this time, two kinds of ions are injected or implanted at the boundary between the n+ type doped regions 22 and 23 and the p+ type doped region 26 with they overlapping with each other (FIG. 6(c)).

Figure 6A:
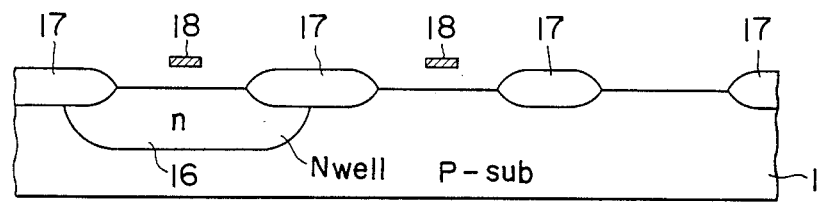
FIG. 6 is a process diagram showing a method of manufacturing an input protection circuit according to this invention.
Figure 6B:
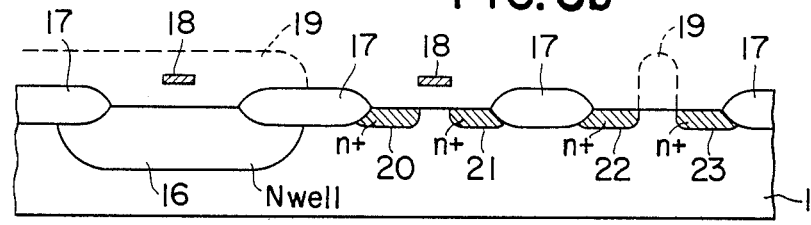
Figure 6C:
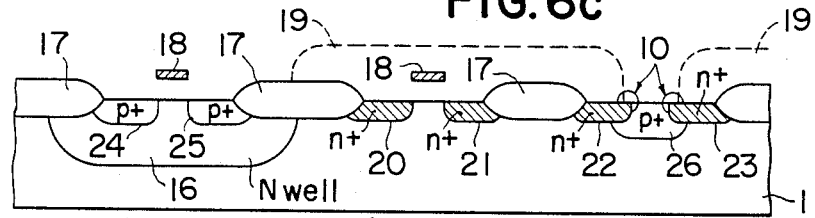
Figure 6D:
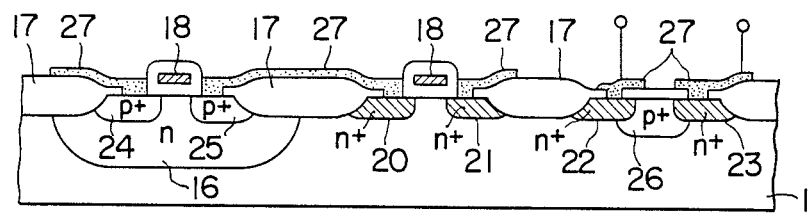
Figure 6E:
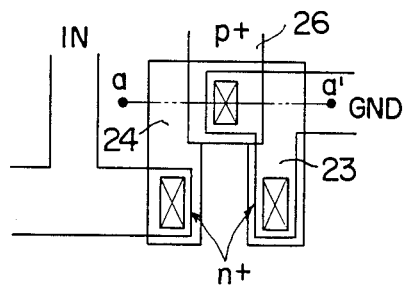

Then, by accumulation of Al and selective etching, an Al wiring layer 27 is formed. This Al wiring layer 27 connects the n+ type doped regions 22 and 23 to the input terminal IN and the ground level GND, respectively. Thus, the p channel MOS FET, the n channel MOS FET and the input protection circuit are formed (FIG. 6(d)). FIG. 6(e) is a plan view of the input protection network shown in FIG. 6(d).

As just described above, the input protection circuit or network according to this invention can be manufactured, e.g., in the process for manufacturing CMOS in the MOS integrated circuit without increasing the number of steps.

While the input protection circuits or networks in the CMOS formed on a p-type semiconductor substrate have been described in the above-mentioned embodiments, the input protection circuits or networks in the NMOS or PMOS may be used, and CMOS may be formed on an n-type semiconductor substrate if the conductivity types of impurity regions forming the input protection network are reversed.

As is clear from the foregoing description, the input protection circuit or network according to this invention is implemented to provide a p-n junction of which breakdown voltage is low, thus to bring about a stable breakdown, thereby making it possible to raise a withstand voltage for preventing electrostatic breakdown due to an input of a high potential.

What is claimed is:

1. An input protection circuit comprising:
   a heavily doped region of a second conductivity type which is formed on a semiconductor substrate of a first conductivity type, and connected to an input terminal; and
   a heavily doped region of the first conductivity type which is formed on said semiconductor substrate of the first conductivity type with it being in contact with said heavily doped region of the second conductivity type, and being surrounded by said heavily doped region of the second conductivity type.

2. A circuit as set forth in claim 1, wherein said heavily doped region of the second conductivity type is common to the drain of an output MOS transistor, thus providing a function to output a signal from said input terminal.

3. A circuit as set forth in claim 1, wherein said heavily doped region of the second conductivity type is common to the drain of an output MOS transistor, thus providing a function to output a signal from said input terminal.

4. An input protection circuit comprising:
   a first heavily doped region of a second conductivity type which is formed on a semiconductor substrate of a first conductivity type, and connected to an input terminal;
   a heavily doped region of the first conductivity type which is formed on said semiconductor substrate of the first conductivity type with it being in contact with said first heavily doped region of the second conductivity type, and being surrounded by said first heavily doped region of the second conductivity type; and
   a second heavily doped region of the second conductivity type which is formed on said semiconductor substrate of the first conductivity type with it being opposite to said first heavily doped region of the second conductivity type, and connected to a reference power source.

5. A circuit as set forth in claim 4, wherein said heavily doped region of the first conductivity type is located between said first heavily doped region of the second conductivity type and said second heavily doped region of the second conductivity type.

6. A circuit as set forth in claim 4, wherein said heavily doped region of the second conductivity type is common to the drain of an output MOS transistor, thus providing a function to output a signal from said input terminal.

7. A circuit as set forth in claim 5, wherein said heavily doped region of the second conductivity type is common to the drain of an output MOS transistor, thus providing a function to output a signal from said·input terminal.

* * * * *